United States Patent
Brueckner et al.

(10) Patent No.: US 7,802,830 B2
(45) Date of Patent: Sep. 28, 2010

(54) METHOD AND DEVICE FOR HANDLING AN ARTICLE IN THE COURSE OF SEMICONDUCTOR FABRICATION

(75) Inventors: Gerd Brueckner, Boxdorf (DE); Arthur Deutschlaender, Kleinmachnow (DE); Harald Heinrich, Dresden (DE); Germar Schneider, Dresden (DE); Steffen Schroeder, Franzburg (DE)

(73) Assignee: Qimonda AG, Munich (DE)

( * ) Notice: Subject to any disclaimer, the term of this patent is extended or adjusted under 35 U.S.C. 154(b) by 342 days.

(21) Appl. No.: 11/838,553

(22) Filed: Aug. 14, 2007

(65) Prior Publication Data

US 2008/0038904 A1    Feb. 14, 2008

(30) Foreign Application Priority Data

Aug. 14, 2006    (DE) .................. 10 2006 038 243

(51) Int. Cl.
   *B25J 15/06*    (2006.01)

(52) U.S. Cl. ............ 294/64.1; 294/86.4; 294/902; 294/1.1; 414/941; 901/30; 901/40

(58) Field of Classification Search ............... 294/1.1, 294/64.1, 86.4, 902; 414/935, 941; 901/30, 901/31, 40, 50

See application file for complete search history.

(56) References Cited

U.S. PATENT DOCUMENTS

| 3,140,890 | A | * | 7/1964 | Schwartz ............ 294/1.1 |
| 3,611,744 | A | * | 10/1971 | Sutz ................ 62/263 |
| 3,710,953 | A | * | 1/1973 | Kirsch ............. 414/627 |
| 5,452,932 | A | * | 9/1995 | Griffin ............. 294/1.1 |
| 6,063,697 | A |   | 5/2000 | Wolf et al. |
| 6,431,622 | B1 | * | 8/2002 | Depeursinge et al. ... 294/1.1 |
| 6,491,330 | B1 | * | 12/2002 | Mankame et al. ....... 294/88 |
| 6,573,201 | B1 | * | 6/2003 | Ogure et al. ........ 29/25.01 |
| 7,182,376 | B2 | * | 2/2007 | Maginness ........... 294/1.3 |
| 2005/0098195 | A1 |   | 5/2005 | Jackson |

FOREIGN PATENT DOCUMENTS

DE   10 2005 011 107 A1    9/2006
WO   WO 03/003428 A2       1/2003

* cited by examiner

*Primary Examiner*—Dean J Kramer

(57) ABSTRACT

A method and apparatus for handling an article in semiconductor fabrication in which the article is completely separated from a gripper by a frozen liquid. The gripper includes a feeding device for introducing a liquid such as a high-purity water or a decontaminating liquid. The gripper also includes a cooling device for freezing the liquid. A suction take-in device applies negative pressure to hold the article against the frozen liquid.

20 Claims, 3 Drawing Sheets

METHOD AND DEVICE FOR HANDLING AN ARTICLE IN THE COURSE OF SEMICONDUCTOR FABRICATION

This application claims priority to German Patent Application 10 2006 038 243.9, which was filed Aug. 14, 2006, and is incorporated herein by reference.

TECHNICAL FIELD

An embodiment of the invention relates to a method for handling, in particular gripping, an article in the course of semiconductor fabrication.

BACKGROUND

It is known that grippers are used in the course of semiconductor fabrication, for instance for handling wafers. The term "handling" is to be understood here as meaning any applied mechanical action, whether by gripping, advancing or merely holding or fixing. The term "gripper" is to be understood hereafter as meaning any device with which such handling can be carried out; a "gripper" is consequently to be understood as meaning any kind of "handling device".

With the handling methods that are known today in the area of semiconductor fabrication, it is problematic that the gripping can cause particle soiling or contamination to occur. In order to come to solve this problem of contamination, dedicated installations are used, if materials such as, for example, Cu or high-k materials are used in wafer processing. Such dedicated installations greatly restrict the use or the capacities of the installations used and increase the cost for the semiconductor products produced. Contamination-free handling, or at least handling involving less contamination, of the wafers in the chambers or in the installations involved in semiconductor manufacture would allow utilization and flexibility to be greatly increased, and it could even be possible to do away with expensive clean-room area, since it is possible, depending on the application, when there is a lower risk of contamination to dispense with installations, and consequently no longer need space for these installations.

SUMMARY OF THE INVENTION

In one aspect, the invention provides a method for handling an article in the course of semiconductor fabrication with which the risk of contamination caused by handling is low, or at least significantly reduced in comparison with previous handling methods.

For example, in various methods an article is handled with a gripper that, during the handling of the article, remains completely separated from the article by a frozen liquid.

A major advantage of the method according to an embodiment of the invention is that direct contact between the gripper and the article to be handled is avoided, because separation remains ensured by the frozen liquid. Any contamination of the liquid is in this case irrelevant, because it can be replaced with a new, uncontaminated liquid without any great effort. Preferably, a new or clean liquid is used each time for every handling, in order to avoid any risk of contamination.

A further major advantage of the method according to an embodiment of the invention can be seen in the fact that relatively low temperatures prevail at the gripping location, whereby the risk of contamination, for example, through material diffusion, is reduced still further.

The method is preferably used whenever in the course of semiconductor fabrication elements at high risk of contamination, such as, for example, copper (Cu), gold (Au), silver (Ag), ruthenium (Ru), palladium (Pd), or platinum (Pt) are used. Such elements are particularly critical in terms of contamination, since even at low temperatures of a few 100° C. they can diffuse very fast, for example, into silicon. Installations which apply these substances to the wafer (for example, Cu plating chambers, seed layer sputterers of copper and platinum, etc.) are typically installed in specially dedicated areas (Cu lines) or at least in Cu dedicated installations, where no other wafers (for example, non-Cu wafers) may be processed. If the described handling method is then used, it is possible, for example, for both wafers that have copper and wafers that are free from copper to be processed on the same machine or within the same process chamber. It is consequently then possible to dispense with the dedication. Separation of the entire semiconductor line, for example into "Cu" and "non-Cu" is likewise no longer required. Apart from copper, this also applies to all other elements of those mentioned as critical in terms of contamination. Expensive clean-room area and investment for additional equipment can consequently be saved; furthermore, logistics are simplified.

The handling method described can also be used in the course of semiconductor fabrication for metal oxides used in high-k substances (dielectrics), such as, for example, aluminum oxide ($Al_2O_3$), zirconium oxide ($ZrO_2$), hafnium oxide ($HfO_2$), yttrium oxide ($Y_2O3$), titanium oxide ($TiO_2$) and cobalt (Co), etc. Because of the decreasing pattern width of semiconductor devices, such compounds are increasingly being used in the semiconductor industry for the purpose of insulation in the layer structure of the semiconductor. The substances mentioned and generally similar elements of the 3d transition metals/transition metal oxides and mixtures of their compounds can lead to destruction of the semiconductor products by contamination of the elements in the compounds, even if these elements are not quite as critical in terms of contamination as the metals already mentioned since they cannot diffuse as quickly into silicon substrates. Nevertheless, dedications have previously likewise often been introduced in these process steps but can be avoided if the handling method described is used.

In addition, the handling method described can be used in the course of semiconductor fabrication for elements that are "generally" critical in terms of contamination, such as calcium (Ca), sodium (Na), potassium (K), magnesium (Mg) and iron (Fe). These elements are likewise elements that are critical in terms of contamination, since they are very widely found in nature (for example, in the Earth's crust) and, with decreasing pattern width, increasingly represent a challenge to the contamination strategy of any clean room for the manufacture of semiconductor devices, solar cells, data carriers such as CDs, DVDs, hard disks or medical products. In the semiconductor industry, the risk of contamination can be greatly reduced, and conversely the electrical yields greatly improved, by use of the "cryogenic gripping" described. If the international roadmaps of the semiconductor industry are followed, it is evident that the limits for contaminants with trace elements will shift in the next few years from the ppb range (parts per billion) into the ppt range (parts per trillion); the principle proposed here of "cryogenic gripping" in the course of semiconductor fabrication can help to achieve these limits in the future.

With regard to particularly low contamination, it is, as already explained, regarded as advantageous if the article is handled under clean-room conditions.

Examples of articles that can be handled are semiconductor substrates, in particular semiconductor wafers of silicon, silicon-germanium or related materials, wafer cassettes, masks or mask cassettes and other sensitive devices.

In order to avoid contamination by the liquid, high-purity water is preferably used as the liquid and frozen.

It is alternatively also possible for a decontaminating liquid, that is to say, for example, a liquid that acts almost as a cleaning liquid which removes an already existing contamination, to be frozen as the liquid. For example, a dilute acid may be frozen as a decontaminating liquid. Suitable examples are acids or solutions comprising HCl, $HNO_3$ and/or HF. In other embodiments suitable fluids such as solvents (organic) may also be used.

With a view to simple removal of the liquid after thawing, it is regarded as advantageous if the thawing liquid is collected by a collecting opening, which is located spatially below the gripping region formed by the frozen liquid; such an arrangement allows the liquid to be carried away of its own accord by the force of gravity.

In order to ensure complete and rapid collection, it is regarded as advantageous if a suction extraction opening, with which the liquid is extracted by suction, is used as the collecting opening. Suction extraction ensures that no liquid is undesirably lost and can lead to soiling. Such a suction extraction opening may in principle be arranged in any way desired, because the assistance of gravitational force, though helpful, is not absolutely necessary for carrying away the liquid.

The thawing liquid is advantageously directed to the collecting opening by means of a channel-like depression or groove.

The liquid is preferably introduced into the groove by means of a feeding device and frozen in it by a cooling device. With particular preference, the feeding device is arranged in an upper region of the groove, the collecting opening is arranged in a lower region of the groove and the cooling device is arranged in a middle region of the groove; such an arrangement provides a very simple way of achieving the effect that the liquid is brought by the force of gravity into the region of the cooling device, to be frozen in it, and subsequently, on thawing, is brought likewise by the force of gravity from the cooling region to the collecting opening. Preferably, the groove is kept horizontal to be filled with liquid and is only brought into a vertical position after the freezing of the liquid, whether before or after the handling of the article, in order to use the effect of gravitational force during the thawing.

With particular preference, the liquid is frozen in such a way that a frozen ring of liquid is formed between the article and the gripper. Such a ring allows, for example, a negative pressure, preferably a vacuum, to form within the frozen ring of liquid, additionally keeping the article on the gripper. The ring of liquid may be of any desired shape; it may, for example, be round, oval or otherwise frame-shaped (triangular, rectangular, etc.), as long as it forms a closed contour.

An embodiment of the invention also relates in addition to a method for handling, in particular gripping, an article, to be precise irrespective of whether or not this handling is performed in the course of semiconductor fabrication. According to the invention, it is provided in this respect that a liquid is frozen in such a way that a frozen ring of liquid is formed between the article and the gripper and that a negative pressure which keeps the article on the gripper is produced within the frozen ring of liquid. With respect to the advantages of this method, reference is made to the statements made above.

An embodiment of the invention relates in addition to a gripper for gripping an article. According to the invention, it is provided in this respect that, during the gripping of the article, the gripper is completely separated from the article by a frozen liquid. With respect to the advantages of this gripper, reference is made to the statements made above in connection with the method according to an embodiment of the invention described at the beginning.

Preferably, the gripper has a collecting opening, which is located spatially below a gripping region formed by the frozen liquid and collects thawing liquid by the force of gravity. For example, the collecting opening is formed by a suction extraction opening, which also additionally takes in and extracts the thawing liquid by suction.

With preference, a groove which directs the thawing liquid to the suction extraction opening is present in the gripping region. A feeding device for introducing the liquid into the groove and a cooling device for freezing the liquid are preferably likewise present in the region of the groove. In this case it is preferred that the feeding device is arranged in an upper region of the groove, the suction extraction opening is arranged in a lower region of the groove and the cooling device is arranged in a middle region of the groove. The terms "upper" and "lower" relate, for example, to a vertical position of the groove, into which the gripper can be brought at least for the thawing of the liquid. The cooling device may have, for example, a Peltier module.

Preferably, the gripper consists on the outside, at least in the gripping region, of Teflon or a titanium/aluminum alloy.

It is also regarded as advantageous if a cooling device is present, freezing the liquid in such a way that a frozen ring of liquid is formed between the article and the gripper. Such a configuration of the gripper is also regarded as an independent invention, irrespective of whether or not, during the gripping of the article, said gripper is completely separated from the article by a frozen liquid.

Preferably, a suction take-in device is also present, producing a negative pressure, preferably a vacuum, within the frozen ring of liquid.

A further use of the cryogenic principle described may otherwise lie in the area of the closure of installation doors on semiconductor equipment. This is because it is possible here, for example, by means of a frozen film of liquid in the closure of the door and subsequent specifically controlled thawing to use a cleaning effect that helps to keep the closure of the door clean and free from particles. Accordingly, a closure for an installation door that is equipped with a freezing device or is in connection with a freezing device and with which a frozen film of liquid can be formed is regarded as an independent invention.

BRIEF DESCRIPTION OF THE DRAWINGS

An embodiment of the invention is explained in more detail below on the basis of exemplary embodiments, in respect of which by way of example.

DETAILED DESCRIPTION OF ILLUSTRATIVE EMBODIMENTS

Figure 1:
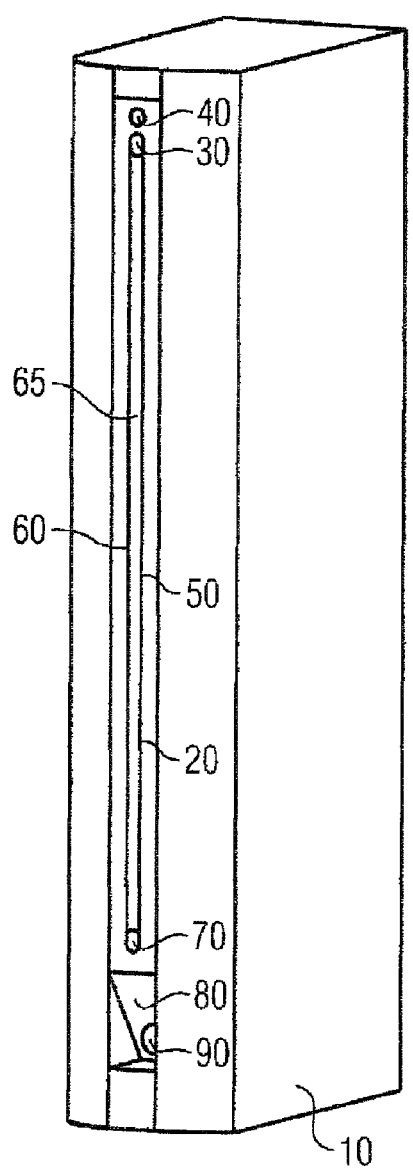
FIG. 1 shows a first exemplary embodiment of a cryogenic gripper according to an embodiment of the invention, on the basis of which the method according to an embodiment of the invention is also explained by way of example.

In FIG. 1, an exemplary embodiment of a cryogenic gripper 10, hereafter referred to as gripper for short, can be seen. The gripper 10 has, arranged on the outer side of the gripper housing, a depression or groove 20, which can be brought into a vertical position when the gripper 10 is used for handling an article.

In the upper region 30 of the groove 20 there is a feeding device 40, with which liquid can be introduced into the groove 20.

In the middle region 50 of the groove 20 there is a cooling device 60 for freezing the liquid; the cooling device 60 may comprise, for example, an aluminum wire 65, which can be cooled by a Peltier element (not shown any further).

In the lower region 70 of the groove 20 there is a channel 80 with a suction extraction opening 90, with which thawing liquid can be extracted by suction.

Figure 2:
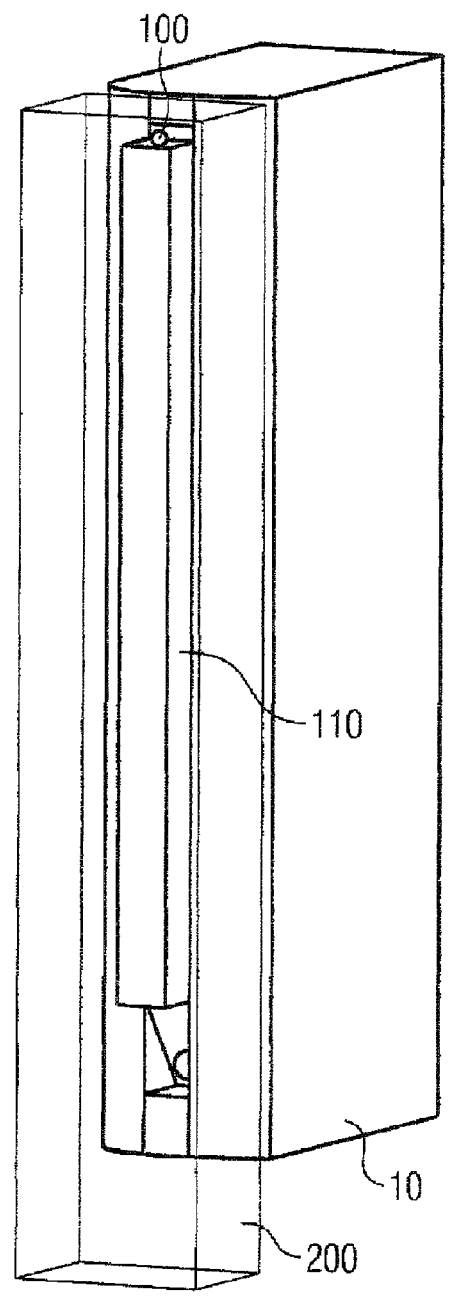
FIG. 2 shows the cryogenic gripper that is shown in FIG. 1 after the forming of a frozen film of liquid.

The gripper 10 can be operated, for example, as follows. If an article 200, for example, a wafer, is to be moved in the course of semiconductor fabrication under clean-room conditions, a preferably unused, fresh liquid 100 (see FIG. 2) is introduced into the groove 20 by the feeding device 40. The liquid is preferably a high-purity water or a decontaminating liquid based on a solution of acid comprising HCl, $HNO_3$ and/or HF.

Under the effect of gravity, the liquid 100 will flow downward into the middle region 50 of the groove 20 and be frozen there by the cooling device 60; this causes the formation of a frozen layer of liquid, which is referred to hereafter as "ice layer" 110 for short. Alternatively, the filling with the liquid 100 may also be performed in a horizontal position of the groove 20.

The wafer 200 is subsequently gripped by the gripper 10 in such a way that exclusively the ice layer 110 comes into contact with the wafer 200; other parts, in particular parts of the gripper 10, do not thereby touch the wafer.

Once the wafer has been handled in the way desired, for example, held and/or moved, and the ice layer 110 has been separated from the wafer, the ice layer 110 is thawed. This can take place by the cooling device 60 being switched off. Alternatively or in addition, the aluminum wire 65 may be heated by a heating device (not represented any further). Such a heating device may, for example, likewise be formed by the already mentioned Peltier element. If the Peltier element also forms the heating element, this is preferably simply reversed in its polarity for the heating.

As soon as the ice layer 110 melts, the liquid 100 forming runs under the effect of gravity into the channel 80 and from there to the suction extraction opening 90, with which it is finally extracted by suction.

The liquid extracted by suction passes from there to a collecting container (not shown any further). In the case of a high permissible contamination limit, the collected liquid is used again, in that it is reintroduced into the groove 20 by means of the feeding device 40 for a new gripping operation. In the case of a low permissible contamination limit, the liquid 100 is not used again or is at least subjected to a cleaning or decontamination step before further use.

Figure 3:
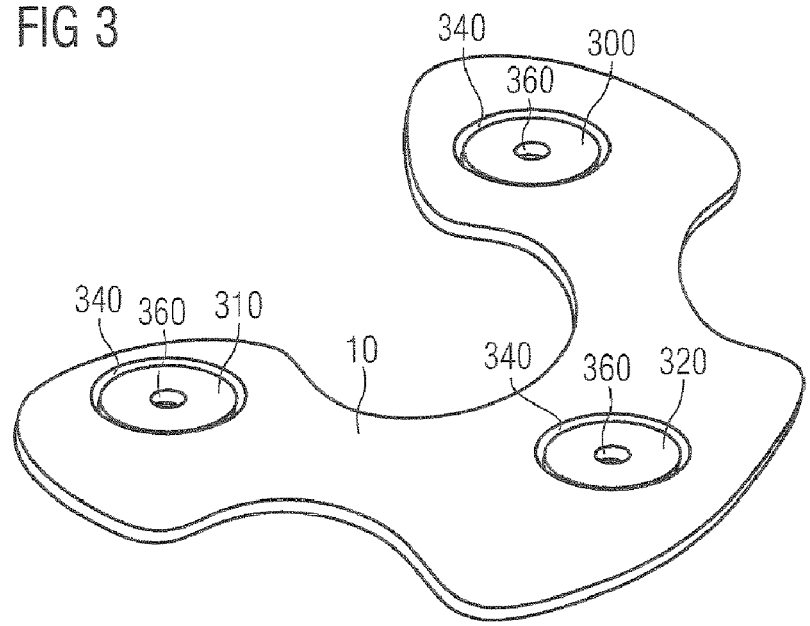
FIG. 3 shows a second exemplary embodiment of a cryogenic gripper according to an embodiment of the invention with three vacuum-assisted gripping regions.

In FIG. 3, a further exemplary embodiment of a cryogenic gripper 10 can be seen.

This cryogenic gripper is equipped with three vacuum-assisted gripping regions 300, 310 and 320. Each of the three vacuum-assisted gripping regions 300, 310 and 320 respectively has an annular groove 340. Each groove 340 is respectively equipped with a plurality of feed openings 350 for the feeding of a liquid; the feed openings 350 can be seen in FIG. 5, which shows one of the three vacuum-assisted gripping regions 300 in detail.

Each of the three vacuum-assisted gripping regions 300, 310 and 320 is also equipped with an opening 360, to which a suction take-in device (not shown any further in the figures) is connected. The suction take-in device may, for example, be a vacuum pump. Although shown to be centrally located, opening 360 may also be located in other locations of gripping regions 300, 310 and 320.

Figure 4:
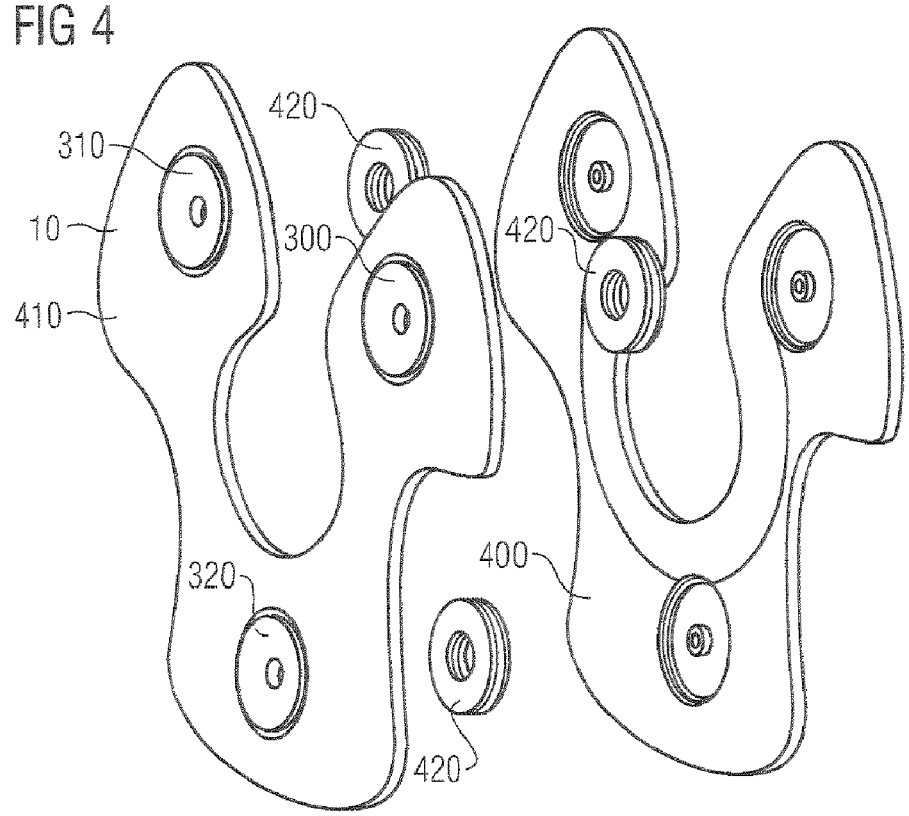
FIG. 4 shows the cryogenic gripper that is shown in FIG. 3 in an exploded representation.

In FIG. 4, the gripper 10 according to FIG. 3 is shown in an exploded representation. Two plate parts 400 and 410 can be seen, clamped between which are three Peltier elements 420. Each Peltier element 420 respectively forms a cooling device for freezing the liquid that is located in the assigned annular groove 340.

Figure 5:
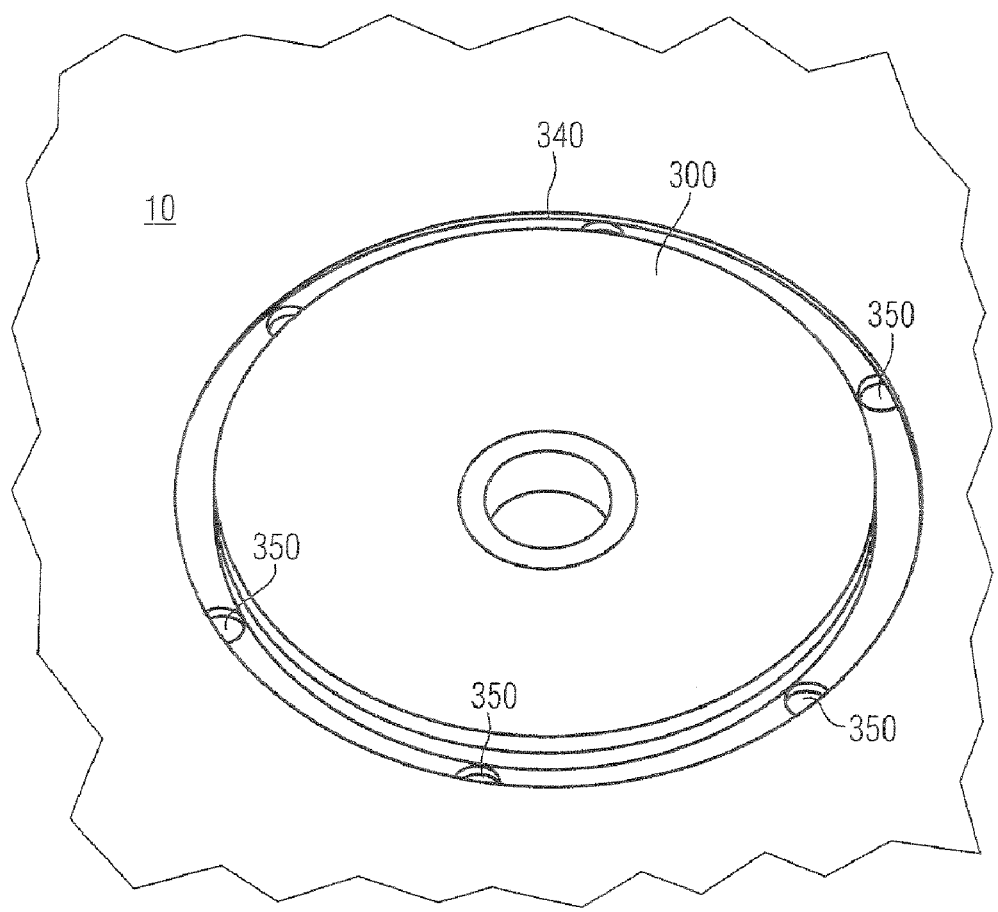
FIG. 5 shows in detail one of the three vacuum-assisted gripping regions of the cryogenic gripper that is shown in FIG. 3.

In the case of the exemplary embodiment according to FIGS. 3 to 5, by way of example the plate part 410 is facing the article to be held; the plate part 410 consequently forms an outer side of the gripper 10 that is facing the article.

The cryogenic gripper 10 shown in FIGS. 3 to 5 can be operated, for example, as follows:

Firstly, the annular grooves 340 are filled with a liquid, such as, for example, high-purity water, through the feed openings 350; for this purpose, the annular grooves 340 are preferably aligned horizontally. The high-purity water is frozen by means of the Peltier elements 420, so that raised rings of ice, or rings of ice protruding outward beyond the outer surface of the plate part 410, form in the grooves 340. Subsequently, the rings of ice are placed on a wafer to be gripped; only the rings of ice thereby come into contact with the wafer, but not the plate part 410. A vacuum is produced by using suction to extract the air from the annular regions delimited by the rings of ice through the openings 360, whereby the wafer and the plate part 410 are held together; the rings of ice thereby act as a lateral seal. Direct contact between the plate part 410 and the wafer does not occur, since the mechanical contact is only provided by the rings of ice.

The gripping connection is released by the vacuum being switched off and the freezing process subsequently being ended, after the wafer has been deposited at a desired location; after that, the gripper is moved back.

After thawing, the high-purity water can, for example, run away under the effect of gravity via the feed openings 350, as long as the gripper 10 is kept approximately horizontal, to be precise with the plate part 410 directed upward. Alternatively, the high-purity water may also be extracted by suction, whether via the feed openings 350 or by a separate additional device that is not shown. The residual moisture on the wafer is dissipated into the ambient air in the course of further processing, for example, by evaporation as a result of the constantly low atmospheric humidity in the clean room.

What is claimed is:

1. A method for handling an article in semiconductor fabrication, the method comprising:
    freezing a liquid with a gripper to form a frozen liquid;
    gripping the article by the gripper, wherein the gripper remains completely separated from the article by the frozen liquid;
    thawing the frozen liquid after the handling of the article; and
    collecting a thawed frozen liquid by a collecting opening located spatially below the frozen liquid; and wherein a suction extraction opening, by which the thawed frozen liquid is extracted by suction, is used as the collecting opening.

2. The method as claimed in claim 1, wherein the article is handled under clean-room conditions.

3. The method as claimed in claim 1, wherein the article comprises an article selected from the group consisting of a semiconductor wafer, a wafer cassette, a mask or a mask cassette.

4. The method as claimed in claim 1, wherein the frozen liquid comprises high-purity water.

5. The method as claimed in claim 1, wherein the frozen liquid comprises a decontaminating liquid.

6. The method as claimed in claim 5, wherein the decontaminating liquid comprises a dilute acid.

7. The method as claimed in claim 6, wherein the dilute acid comprises HCl, $HNO_3$ and/or HF.

8. The method as claimed in claim 1, wherein the thawed frozen liquid is directed to the collecting opening by means of a groove.

9. The method as claimed in claim 8, wherein, before freezing to form the frozen liquid, the liquid is introduced into the groove by means of a feeding device and frozen in it by a cooling device.

10. The method as claimed in claim 1, wherein the liquid is frozen to form a frozen ring of liquid on an outer side of the gripper.

11. The method as claimed in claim 10, further comprising applying a negative pressure within the frozen ring of liquid to keep the article on the gripper.

12. A method for gripping an article with a gripper, the method comprising:
   freezing a liquid to form a frozen ring of liquid on an outer side of the gripper;
   placing the frozen ring of liquid onto the article; and
   applying a negative pressure between the article and the gripper, within the frozen ring of liquid to hold the article on the gripper.

13. A gripper for handling an article, comprising:
   a cooling device for freezing a liquid to form a frozen ring of liquid on an outer side of the gripper; and
   a suction take-in device for applying a negative pressure within the frozen ring of liquid, wherein the negative pressure is applied as soon as the frozen ring of liquid is placed onto an article to be handled;
   wherein, during the gripping of the article, the gripper is completely separated from the article by the frozen ring of liquid.

14. The gripper as claimed in claim 13, wherein the gripper has a collecting opening, located spatially below a gripping region formed by the frozen ring of liquid, wherein the collecting opening collects a thawed frozen liquid.

15. The gripper as claimed in claim 14, wherein the collecting opening is formed by a suction extraction opening, which extracts the thawed frozen liquid by suction.

16. The gripper as claimed in one of claim 14, wherein a groove is present in the gripping region.

17. The gripper as claimed in claim 16, further comprising a feeding device for introducing the liquid into the groove and a cooling device for freezing the liquid.

18. The gripper as claimed in claim 13, wherein the negative pressure is close to vacuum pressure.

19. A method for handling an article in semiconductor fabrication, the method comprising:
   freezing a liquid with a gripper to form a frozen liquid;
   gripping the article by the gripper, wherein the gripper remains completely separated from the article by the frozen liquid; and wherein the frozen liquid comprises a decontaminating liquid formed from a dilute acid.

20. The method as claimed in claim 19, wherein the dilute acid comprises HCl, $HNO_3$ and/or HF.

\* \* \* \* \*